(12) United States Patent
Leobandung (10) Patent No.: US 9,685,501 B2
(45) Date of Patent: Jun. 20, 2017

(54) LOW PARASITIC CAPACITANCE FINFET DEVICE

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 451 days.

(21) Appl. No.: 14/242,907

(22) Filed: Apr. 2, 2014

(65) Prior Publication Data

US 2015/0287776 A1  Oct. 8, 2015

(51) Int. Cl.
| | | |
|---|---|---|
| H01L 29/06 | (2006.01) | |
| H01L 29/66 | (2006.01) | |
| H01L 29/08 | (2006.01) | |
| H01L 29/16 | (2006.01) | |
| H01L 29/423 | (2006.01) | |
| H01L 29/786 | (2006.01) | |

(52) U.S. Cl.
CPC ...... *H01L 29/0607* (2013.01); *H01L 29/0649* (2013.01); *H01L 29/0673* (2013.01); *H01L 29/0847* (2013.01); *H01L 29/16* (2013.01); *H01L 29/4236* (2013.01); *H01L 29/42392* (2013.01); *H01L 29/66545* (2013.01); *H01L 29/78696* (2013.01)

(58) Field of Classification Search
CPC .............................................. H01L 21/823487
See application file for complete search history.

(56) References Cited

U.S. PATENT DOCUMENTS

| | | | |
|---|---|---|---|
| 6,962,843 B2 | 11/2005 | Anderson et al. | |
| 7,148,526 B1 | 12/2006 | An et al. | |
| 7,259,425 B2 | 8/2007 | An et al. | |
| 7,863,674 B2 | 1/2011 | Yeo et al. | |
| 8,053,839 B2 | 11/2011 | Yeo et al. | |
| 8,119,470 B2 | 2/2012 | Ekbote et al. | |
| 8,232,618 B2 | 7/2012 | Breyta et al. | |
| 8,334,181 B1 | 12/2012 | An et al. | |
| 8,450,813 B2 | 5/2013 | Luo et al. | |
| 2004/0075121 A1 | 4/2004 | Yu et al. | |
| 2005/0019993 A1* | 1/2005 | Lee .................. | H01L 21/84 438/157 |

(Continued)

*Primary Examiner* — Mohammad Choudhry
(74) *Attorney, Agent, or Firm* — Brian M. Restauro (57) ABSTRACT

Embodiments in accordance with the present invention include a method of fabricating a finFET device comprising forming a dielectric layer over the top surface of a semiconductor substrate. A first semiconductor layer is deposited over the dielectric layer. A second semiconductor layer is then deposited over the first semiconductor layer, such that the first semiconductor layer can be preferentially etched with respect to the second semiconductor layer. At least a fin is formed in the second semiconductor layer. A portion of the first semiconductor layer is removed from beneath a portion of the fin such that the bottom surface of the fin is exposed. A gate oxide layer is deposited over the fin such that the gate oxide layer surrounds a portion of the fin, and a gate structure is deposited over at least a portion of the gate oxide layer such that the gate structure surrounds the fin.

4 Claims, 8 Drawing Sheets

(56) References Cited

U.S. PATENT DOCUMENTS

| 2008/0230824 A1* | 9/2008 | Doornbos | H01L 21/28273 |
| | | | 257/315 |
| 2010/0065887 A1* | 3/2010 | Goebel | H01L 29/045 |
| | | | 257/192 |
| 2015/0115370 A1* | 4/2015 | Liu | H01L 27/0886 |
| | | | 257/401 |

* cited by examiner

LOW PARASITIC CAPACITANCE FINFET DEVICE

FIELD OF THE INVENTION

The present invention relates generally to the fabrication of semiconductor devices, and more particularly to the fabrication of a finFET device.

BACKGROUND OF THE INVENTION

Field effect transistors (FETs) can be semiconductor devices fabricated on a bulk semiconductor substrate or on a silicon-on-insulator (SOI) substrate. FET devices generally consist of a source, a drain, a gate, and a channel between the source and drain. The gate is separated from the channel by a thin insulating layer, typically of silicon oxide, called the gate oxide. A voltage drop generated by the gate across the oxide layer induces a conducting channel between the source and drain thereby controlling the current flow between the source and the drain. Current integrated circuit designs use complementary metal-oxide-semiconductor (CMOS) technology that use complementary and symmetrical pairs of p-type and n-type metal oxide semiconductor field effect transistors (MOSFETs) for logic functions.

The integrated circuit industry is continually reducing the size of the devices, increasing the number of circuits that can be produced on a given substrate or chip. It is also desirable to increase the performance of these circuits, increase the speed, and reduce the power consumption. A three-dimensional chip fabrication approach, such as a finFET, has been developed for semiconductor devices. A finFET is a non-planar FET. The "fin" is a narrow, vertical silicon base channel between the source and the drain. The fin is covered by the thin gate oxide and bordered on two or three sides by an overlying gate structure. The multiple surfaces of the gate, allow for more effective suppression of "off-state" leakage current. The multiple surfaces of the gate also allow enhanced current in the "on" state, also known as drive current. These advantages translate to lower power consumption and enhanced device performance.

Polysilicon has been a preferred material for use as a gate electrode due to its thermal resistive properties and ability to withstand subsequent high temperature processes. Due to the higher resistivity of the polysilicon versus metal materials, a polysilicon gate may operate at much slower speeds than gates made of a metallic material. A further performance enhancement uses a replacement metal gate (RMG). This process removes the original polysilicon gate and replaces it with a metal gate material. A high-k dielectric can also be used as the gate oxide as a part of the RMG process.

Process challenges exist as the dimensions of the devices decrease, some now falling below 20 nm. As the dimensions of the device decrease, the spacing between the various circuit elements also decreases leading to increased parasitic capacitance. Parasitic capacitance is the unwanted capacitance that exists between the parts of an electronic component or circuit simply because of their proximity to each other. The increased parasitic capacitance can have detrimental effects on the circuit performance, limiting the frequency response of the device.

SUMMARY

Embodiments in accordance with the present invention provide a low parasitic capacitance finFET device and include a method of fabricating the same. In the method of fabrication of the low parasitic capacitance finFET device, a dielectric layer is formed over the top surface of a semiconductor substrate. A first semiconductor layer is deposited over the dielectric layer. A second semiconductor layer is then deposited over the first semiconductor layer, such that the first semiconductor layer can be preferentially etched with respect to the second semiconductor layer. At least a fin is formed in the second semiconductor layer. A portion of the first semiconductor layer is removed from beneath a portion of the fin such that the bottom surface of the fin is exposed. A gate oxide layer is deposited over the fin such that the gate oxide layer surrounds a portion of the fin, and a gate structure is deposited over at least a portion of the gate oxide layer such that the gate structure surrounds the fin.

DETAILED DESCRIPTION

Embodiments in accordance with the present invention generally provide a reduced parasitic capacitance finFET device. Forming a buried gate structure wherein the gate is beneath the fin of a finFET device can allow for reduced height of the gate above the fin thereby reducing the proximity of the gate to the source/drain contacts. The reduced surface area of the gate in proximity to the source/drain contacts can reduce the parasitic capacitance of the finFET device. Detailed descriptions of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Figure 1:
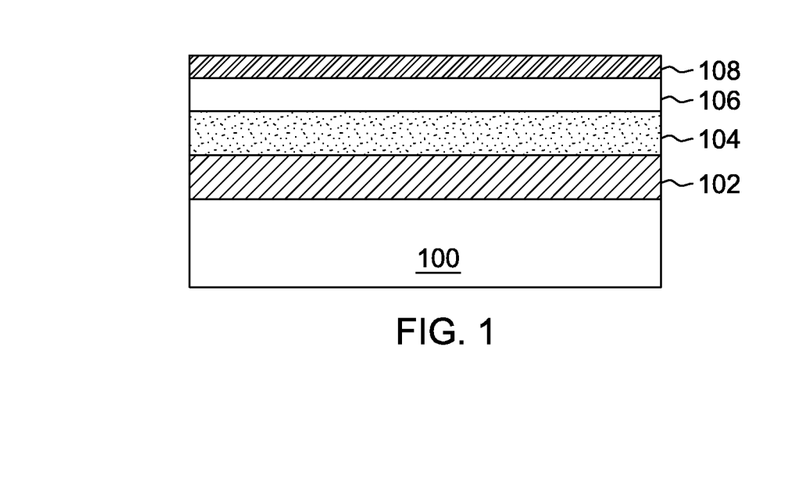
FIG. 1 depicts a cross-sectional view of a semiconductor substrate upon which a finFET structure may be fabricated, in accordance with embodiments of the invention.

Referring now to the figures, FIG. 1 depicts a cross-sectional view of semiconductor substrate 100 upon which a finFET structure may be fabricated, in accordance with embodiments of the invention. Semiconductor substrate 100 is a semiconductor material, preferably a silicon-containing material including, but not limited to, silicon, silicon germanium alloys, silicon carbon alloys, or silicon germanium carbon alloys. In an embodiment, the finFET structure is built on a silicon-on-insulator (SOI) substrate in which semiconductor substrate 100 includes buried oxide layer (BOX) 102, a first semiconductor layer 104 on BOX 102, and a second semiconductor layer 106 on first semiconductor layer 104. In various embodiments, BOX 102 can be silicon oxide ($SiO_2$) that acts to insulate first semiconductor layer 104 from semiconductor substrate 100, with a typical thickness of about 10 nm to about 500 nm, and preferably about 150 nm. BOX 102 can be formed by thermally oxidizing the exposed surface of semiconductor substrate 100, or may be deposited onto semiconductor substrate 100 using, for example, chemical vapor deposition (CVD) or atomic layer deposition (ALD). First semiconductor layer 104 can then be bonded to BOX 102. In various embodiments, first semiconductor layer 104 is silicon/germanium (SiGe) with a typical thickness of about 5 nm to about 40 nm and preferably about 20 nm. First semiconductor layer 104 can be any semiconductor, for example, silicon-containing materials including, but not limited to, silicon germanium alloys, silicon carbon alloys, silicon germanium carbon alloys, or III-V materials, such that first semiconductor layer 104 can be preferentially removed with respect to second semiconductor layer 106 as discussed in further detail below. Second semiconductor layer 106 can be single crystal silicon with a typical thickness of about 5 nm to about 40 nm. It should be appreciated by one skilled in the art that the invention is not limited to silicon, and that other semiconductor materials may be used, for example, silicon-containing materials including, but not limited to, silicon, silicon germanium alloys, silicon carbon alloys, III-V materials, or silicon germanium carbon alloys, such that first semiconductor layer 104 can be preferentially removed with respect to second semiconductor layer 106. Hard mask layer 108 is deposited on second semiconductor layer 106. In various embodiments, hard mask layer 108 can be silicon nitride (SiN) with a typical thickness of about 10 nm, deposited using, for example, low pressure chemical vapor deposition (LPCVD). Hard mask layer 108 can be any hard mask material that can act as an etch mask during the patterning of first semiconductor layer 104 and second semiconductor layer 106 as described in more detail below with respect to FIG. 2A-B.

Figure 2A:
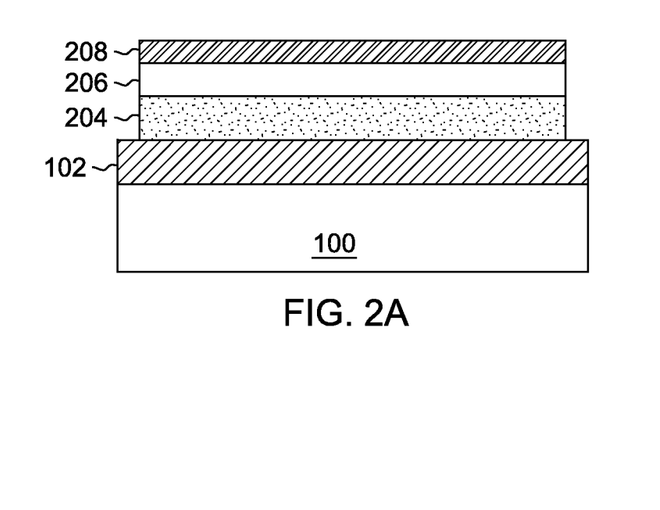
FIGS. 2A and 2B depict cross-sectional views of the formation of a fin in a semiconductor layer in accordance with embodiments of the invention.
Figure 2B:
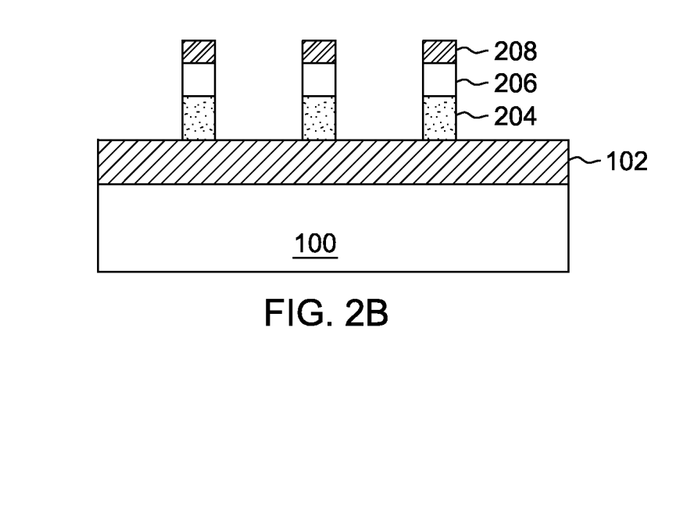

FIGS. 2A and 2B depict cross-sectional views of the formation of fin 206 in semiconductor layer 106 in accordance with embodiments of the invention. Fin 206 can be fabricated from second semiconductor layer 106 using standard lithographic and etching processes known to someone skilled in the art. An imageable layer (not shown) can be deposited on hard mask layer 108 of FIG. 1 and is used as a mask to define the fin hard mask pattern 208 in hard mask layer 108. Fin hard mask pattern 208 can be used, with or without the remaining portions of the imageable layer, to etch second semiconductor layer 106 of FIG. 1 to produce fin 206, and to etch first semiconductor layer 104 of FIG. 1 to produce fin base 204, using, for example, an anisotropic dry etch.

Figure 3A:
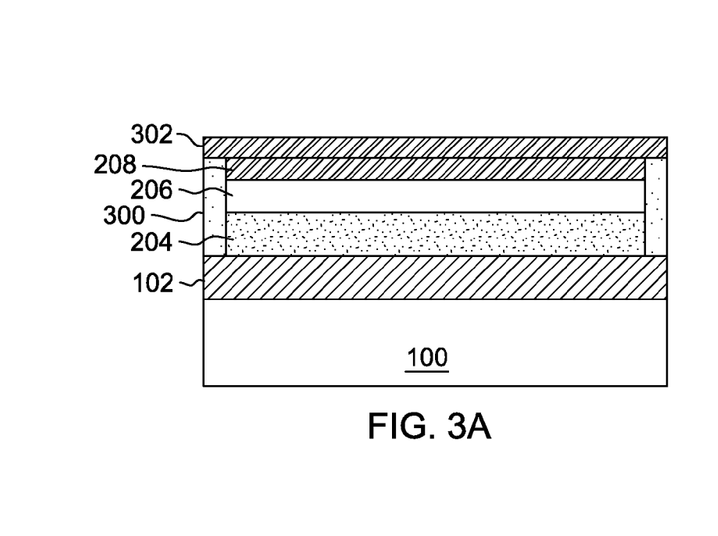
FIG. 3A depicts a cross-sectional view along the length of a fin, showing the deposition of a gate layer in accordance with embodiments of the invention.
Figure 3C:
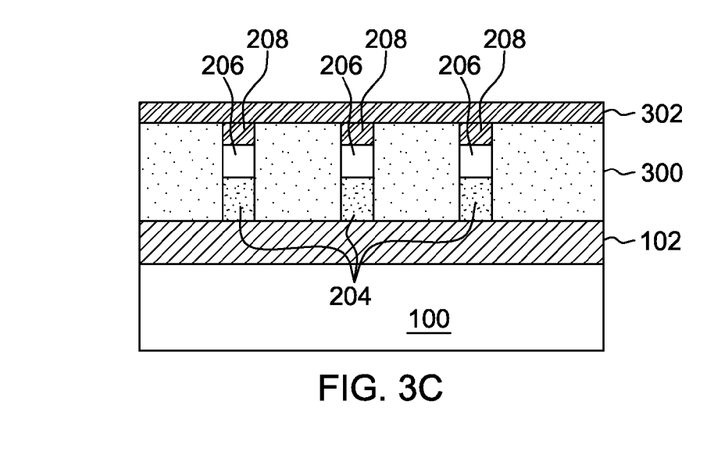
FIG. 3C depicts a cross-sectional view across the fin.

FIG. 3A depicts a cross-sectional view along the length of fin 206, showing the deposition of gate layer 300 in accordance with embodiments of the invention. FIG. 3C depicts a cross-sectional view across fin 206. Gate layer 300 composed of, for example, polysilicon, is deposited over fin base 204, fin 206, and fin hard mask pattern 208. A process such as CVD may be used. In an example embodiment, an insulating layer (not shown), for example of silicon oxide, is deposited over fin base 204, fin 206, and fin hard mask pattern 208 prior to the deposition of gate layer 300. The insulating layer may be formed by thermally oxidizing the exposed surface of fin base 204 and fin 206, or may be deposited onto fin base 204 and fin 206 using, for example, chemical vapor deposition (CVD) or atomic layer deposition (ALD). This insulating layer can protect fin base 204 and fin 206 during the subsequent gate formation as described in more detail below. Following the deposition of gate layer 300, chemical mechanical planarization (CMP) may be used to reduce the height variations in the deposited gate layer 300, stopping at the top surface of fin hard mask pattern 208 of FIG. 2. CMP may use a combination of chemical etching and mechanical polishing to smooth the surface and even out any irregular topography. Second hard mask layer 302, composed of, for example, SiN, can then be deposited on gate layer 300 and fin hard mask pattern 208.

Figure 4A:
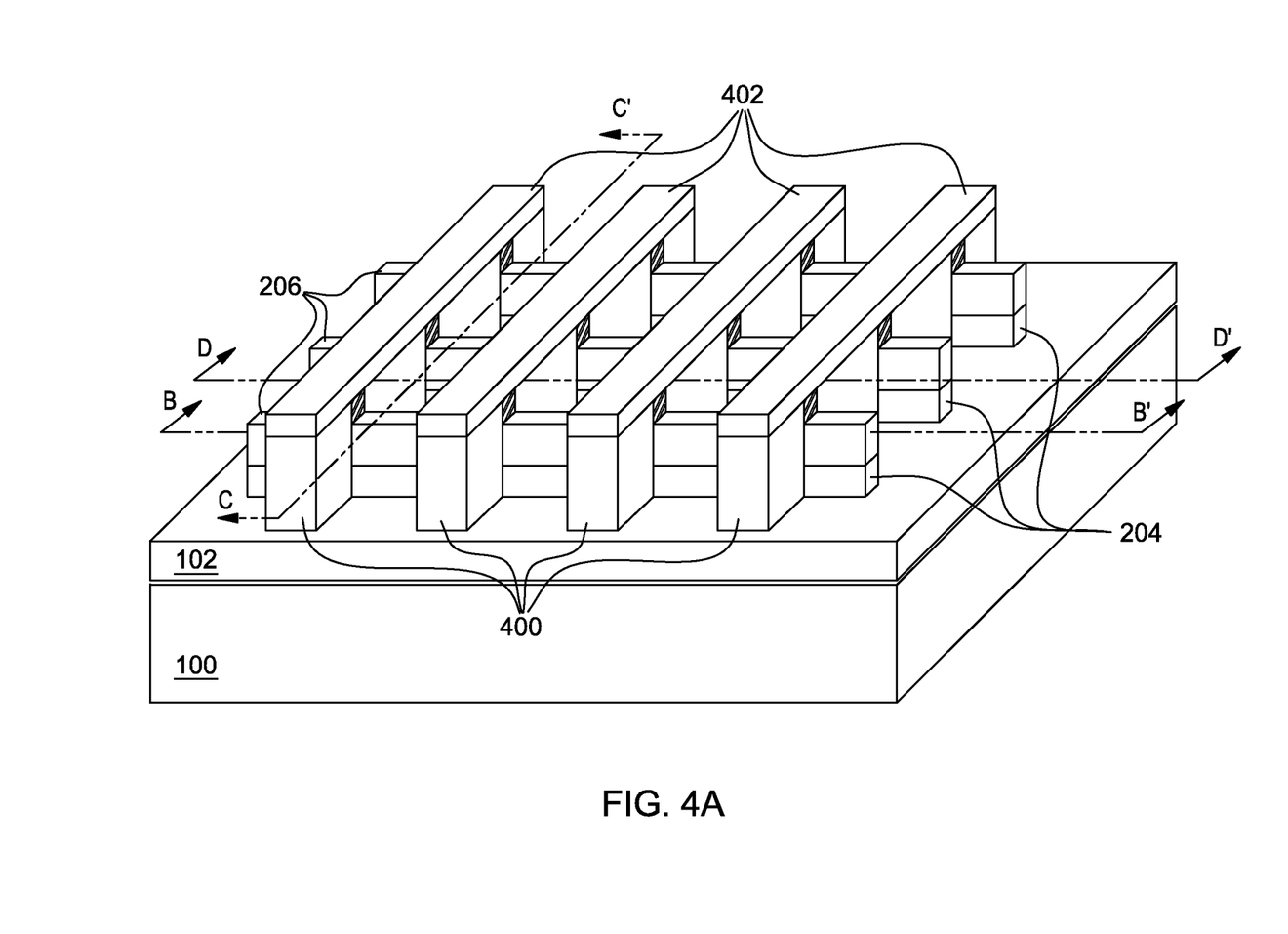
FIG. 4A depicts a perspective view of the formation of dummy gates in a gate layer of FIG. 3A in accordance with embodiments of the invention.
Figure 4B:
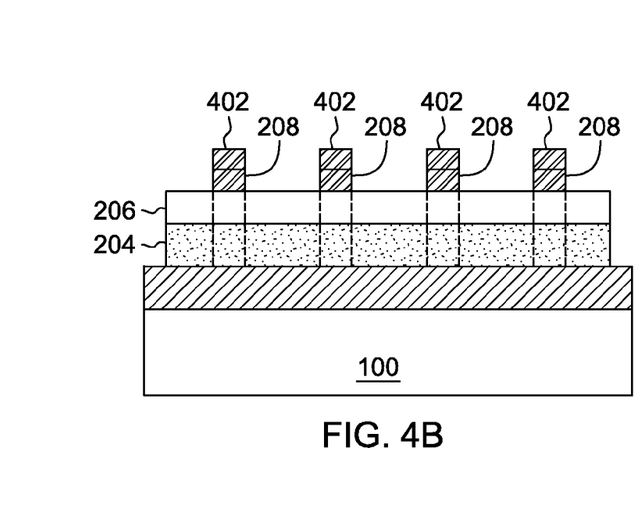
FIG. 4B is a cross-sectional view of FIG. 4A taken through section line B-B' showing a fin base, a fin, and the remaining portions of a fin hard mask pattern and a gate pattern.
Figure 4C:
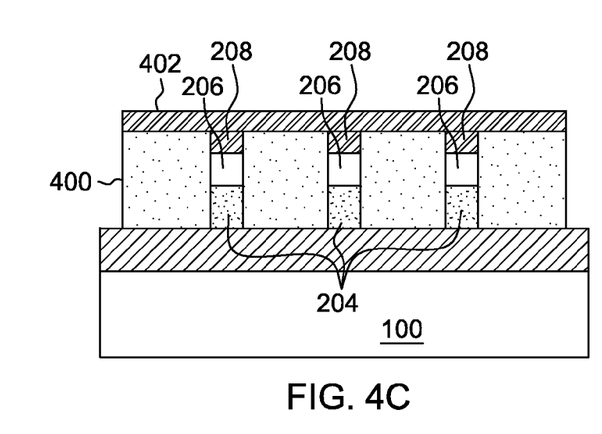
FIG. 4C is a cross-sectional view of FIG. 4A taken through section line C-C' showing a dummy gate covering portions of the sidewalls of a fin base and a fin.

FIG. 4A depicts a perspective view of the formation of dummy gates 400 in gate layer 300 of FIG. 3 in accordance with embodiments of the invention. Dummy gate 400 can be fabricated from gate layer 300 using standard lithographic and etching processes known to someone skilled in the art. In various embodiments, standard lithographic processes are used to define the pattern of dummy gate 400 in an imageable layer (not shown) deposited on second hard mask layer 302 of FIG. 3. Gate pattern 402 may then be formed in second hard mask layer 302 of FIG. 3A, by removing second hard mask layer 302 from the areas not protected by the pattern in the imageable layer. Gate pattern 402 can be used, with or without the remaining portions of the imageable layer (not shown), to etch gate layer 300 of FIG. 3 to produce dummy gate 400 using, for example, wet chemical etching or dry etching. In various embodiments, a wet etch such as tetramethylammonium hydroxide (TMAH) or a dry etch such as reactive ion etch (RIE) may be used to etch gate layer 300 to produce dummy gate 400. FIG. 4B is a cross-sectional view of FIG. 4A taken through section line B-B' showing fin base 204, fin 206, and the remaining portions of fin hard mask pattern 208 and gate pattern 402. FIG. 4C is a cross-sectional view of FIG. 4A taken through section line C-C' showing dummy gate 400 covering portions of the sidewalls of fin base 204 and fin 206. The remaining portion of fin hard mask pattern 208 covers top portions of fin 206 under gate pattern 402.

Figure 5B:
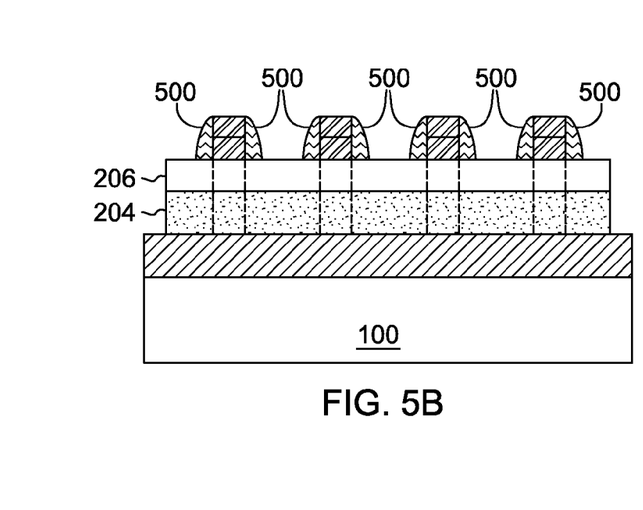
FIG. 5B shows a cross-sectional view taken through the section line B-B' shown in FIG. 4A depicting the formation of a dielectric spacer in accordance with embodiments of the invention.
Figure 5D:
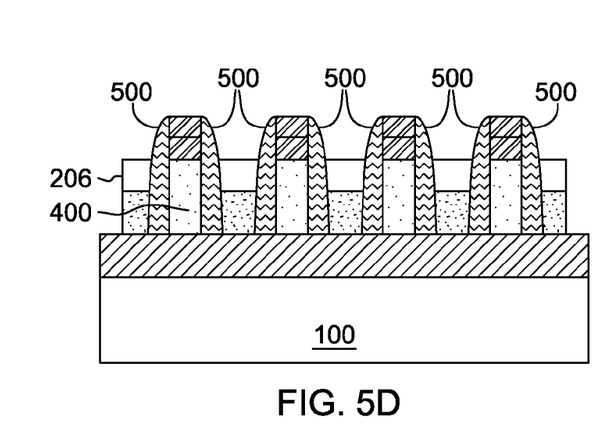
FIG. 5D is a cross-sectional view taken through the section line D-D' shown in FIG. 4A showing the formation of a spacer on the sidewalls of a dummy gate.

FIG. 5B shows a cross-sectional view taken through the section line B-B' shown in FIG. 4A depicting the formation of dielectric spacer 500 in accordance with embodiments of the invention. For example, forming dielectric spacer 500 may include depositing a conformal layer (not shown) of insulating material, such as silicon nitride or silicon dioxide, over fin base 204, fin 206, dummy gate 400, fin hard mask pattern 208 (shown in FIG. 4C), and gate pattern 402, such that the thickness of the deposited layer on the sidewalls of fin base 204, fin 206, dummy gate 400, is substantially the same as the thickness of the deposited layer on the surface of gate pattern 402. An anisotropic etch process, wherein the etch rate in the downward direction is greater than the etch rate in the lateral directions, may be used to remove the insulating layer, thereby forming dielectric spacer 500. The etch process can be controlled such that the insulating layer may be removed from the sidewall surface of fin base 204 and fin 206 while forming dielectric spacer 500. FIG. 5D is a cross-sectional view taken through the section line D-D' shown in FIG. 4A showing the formation of dielectric spacer 500 on the sidewalls of dummy gate 400. FIG. 5B is a cross-sectional view parallel to and through fin 206. FIG. 5D is a cross-sectional view parallel to and between fins 206 showing a cross-sectional view of dummy gate 400 with dielectric spacer 500.

Figure 6B:
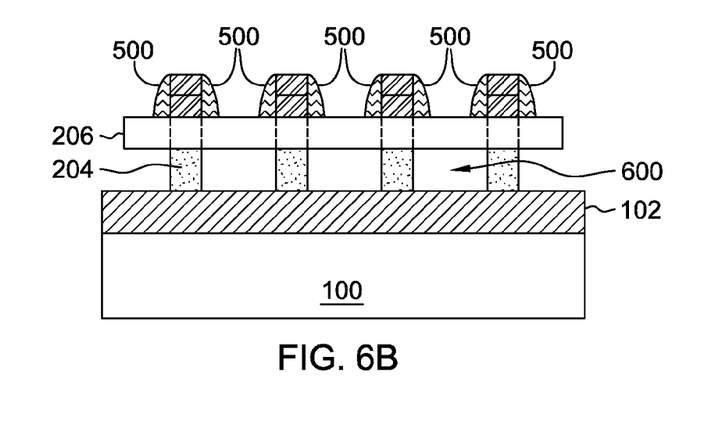
FIG. 6B shows a cross-sectional view taken through the section line B-B' shown in FIG. 4A depicting the removal of a portion of a fin base in accordance with embodiments of the invention.

FIG. 6B shows a cross-sectional view taken through the section line B-B' shown in FIG. 4A depicting the removal of a portion of fin base 204 in accordance with embodiments of the invention. Fin base 204, created from first semiconductor layer 104 of FIG. 1, can be preferentially etched with respect to fin 206 as discussed earlier with reference to FIG. 1. Fin base 204 can be removed from beneath fin 206 in areas not protected by dummy gate 400 creating space 600 beneath fin 206. Fin base 204 can be etched using, for example, hydrogen chloride (HCl) gas with a concentration of between about 10% and 100% at a temperature of about 500° C. to about 600° C. Space 600 is the opening created by the removal of fin base 204 from beneath fins 206 and between dummy gates 400 (not visible in this view).

Figure 7B:
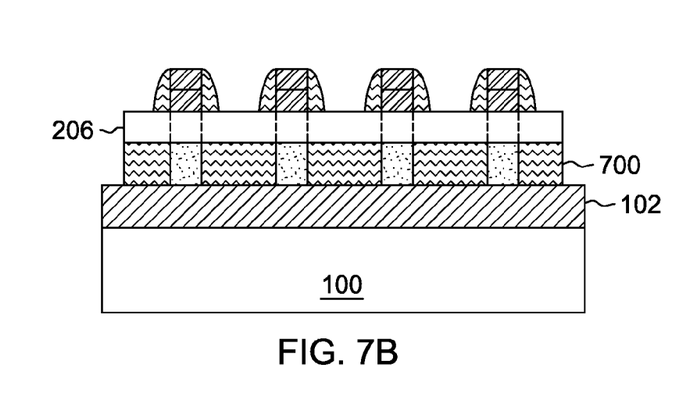
FIG. 7B shows a cross-sectional view taken through the section line B-B' shown in FIG. 4A depicting the deposition of a first insulator layer, in accordance with embodiments of the invention.

FIG. 7B shows a cross-sectional view taken through the section line B-B' shown in FIG. 4A depicting the deposition of first insulator layer 700, in accordance with embodiments of the invention. First insulator layer 700 can be an insulating layer such as SiN, silicon dioxide, or boron nitride (BN). It should be appreciated by one skilled in the art that the invention is not limited to these materials, and that other insulating materials may be used, depending on the desired electrical requirements such as the dielectric constant of the material. First insulator layer 700 can be deposited using, for example CVD, and may be deposited to a sufficient thickness, filling space 600. In various embodiments, the deposited thickness of first insulator layer 700 may then be etched using an anisotropic process such as RIE to etch back the surface of first insulator layer 700 exposing BOX 102, leaving first insulator layer 700 beneath fin 206.

Figure 8B:
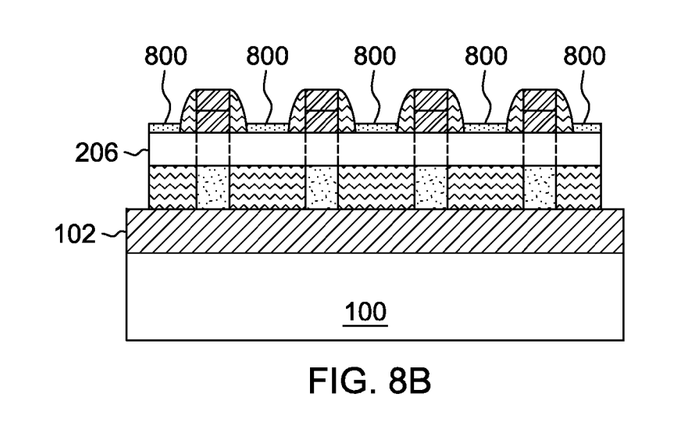
FIG. 8B illustrates an epitaxial layer of doped semiconductor material deposited over portions of a fin to form the source/drain regions of a finFET device, in accordance with embodiments of the invention.
Figure 8C:
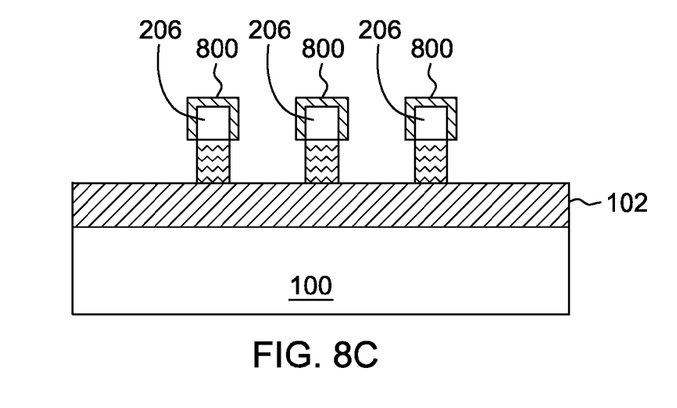
FIG. 8C shows a cross-sectional view taken through the section line C-C' shown in FIG. 4A depicting the selective epitaxial growth of an epitaxial layer over a fin.

FIG. 8B illustrates epitaxial layer 800 of doped semiconductor material deposited over portions of fin 206 to form the source/drain regions of a finFET device, in accordance with embodiments of the invention. In an embodiment, n-type epitaxial silicon or p-type epitaxial silicon may be grown from exposed portions of fin 206 using, for example, selective epitaxy, wherein the epitaxial layer grows only from the exposed portion of fin 206 and does not grow from first insulator layer 700, BOX 102 or spacer 500. The type of dopant is selected based on the type of MOSFET. For example, an nFET type of transistor is doped with an n-type material such as phosphorous. A suitable masking process, such as a patterned layer of SiN, may be used to protect pFET regions during the selective epitaxy of the nFET regions. In various embodiments, the n-type epitaxial silicon is grown selectively using, for example, chemical vapor deposition (CVD). Similarly, a pFET type of transistor is doped with a p-type material such as boron. A suitable masking process, such a patterned layer of SiN, may be used to protect nFET regions during the selective epitaxy of pFET regions. P-type epitaxial silicon may be grown from the exposed portion of fin 206 by selective epitaxy using, for example, CVD. FIG. 8C shows a cross-sectional view taken through the section line C-C' shown in FIG. 4A depicting the selective epitaxial growth of epitaxial layer 800 over fin 206. An annealing step can be performed whereby the dopant of epitaxial layer 800 diffuses into portions of fin 206. Annealing can be performed in a fast anneal tool such as a laser anneal or a rapid thermal anneal. These doped areas form the source and drain regions of the finFET device.

Figure 9B:
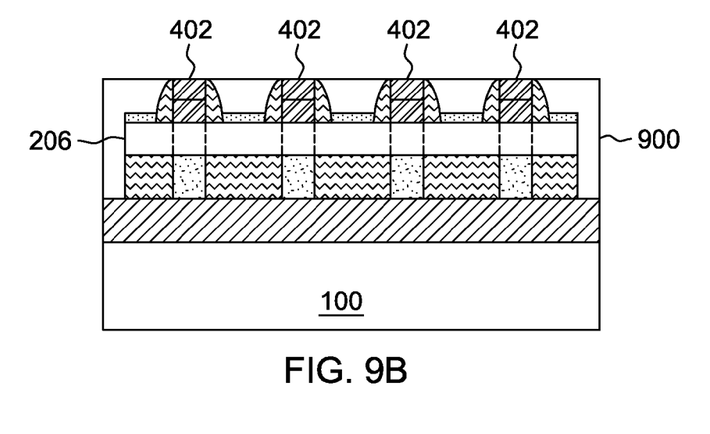
FIG. 9B shows a cross-sectional view taken through the section line B-B' shown in FIG. 4A depicting the deposition of a second insulator layer, in accordance with embodiments of the invention.

FIG. 9B shows a cross-sectional view taken through the section line B-B' shown in FIG. 4A depicting the deposition of second insulator layer 900, in accordance with embodiments of the invention. Second insulator layer 900 can be an insulating layer such as SiN, silicon dioxide, or boron nitride (BN). It should be appreciated by one skilled in the art that the invention is not limited to these materials, and that other insulating materials may be used, depending on the desired electrical requirements such as the dielectric constant of the material. Second insulator layer 900 can be deposited using, for example CVD, and may be deposited to a thickness wherein the top surface is substantially higher above substrate 100 than the top surface of gate pattern 402. Following the deposition of second insulator layer 900, CMP may be used to reduce the height variations in the deposited second insulator layer 900, stopping at the top surface of gate pattern 402 of FIG. 4, thereby exposing the top surface of gate pattern 402.

Figure 10B:
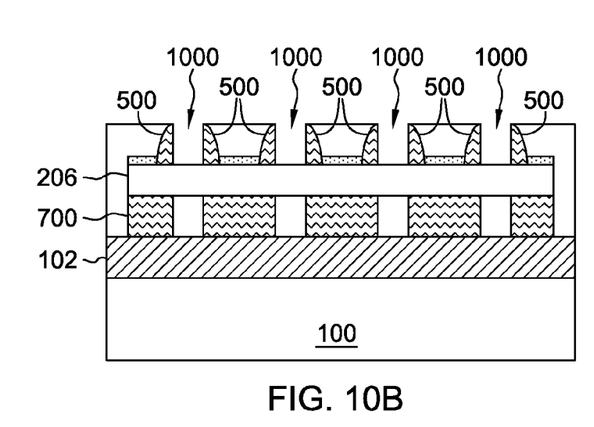
FIG. 10B shows a cross-sectional view taken through the section line B-B' shown in FIG. 4A depicting the formation of a gate trench.
Figure 11B:
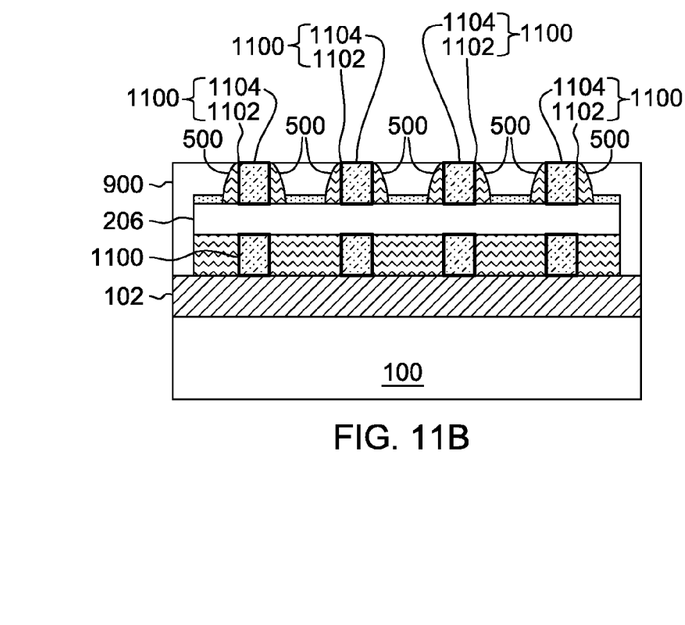
FIG. 11B shows a cross-sectional view taken through the section line B-B' shown in FIG. 4A depicting the formation of a RMG in accordance with embodiments of the invention.

FIGS. 10 and 11 illustrate the RMG process in accordance with embodiments of the invention. FIG. 10B shows a cross-sectional view, taken through the section line B-B' shown in FIG. 4A, depicting the formation of gate trench 1000. Gate trench 1000 is formed by first removing gate pattern 402 and remaining portions of fin hard mask pattern 208 of FIG. 2A, exposing the top of dummy gate 400 of FIG. 4A and portions of fin 206, using for example RIE. A person of ordinary skill in the art will recognize that the type of plasma used will depend on the material of which gate pattern 402 and fin hard mask pattern 208 are composed, or that other etch processes, e.g., wet chemical etch, laser ablation, etc., may be used. The now exposed dummy gate 400 may be removed using a wet chemical etch, such as TMAH, or a dry etch such as RIE, exposing BOX 102 and the sidewalls of spacer 500. The remaining portions of fin base 204 may be removed from beneath fin 206 using, for example HCl gas, creating gate trench 1000 wherein the trench sidewalls are spacer 500 and the exposed portions of first insulator layer 700 beneath fin 206, and the trench base is BOX 102. Additionally, the four sides of portions of fin 206 are exposed by the removal of fin base 204 and dummy gate 400, creating a nanowire that extends through gate trench 1000.

Figure 11C:
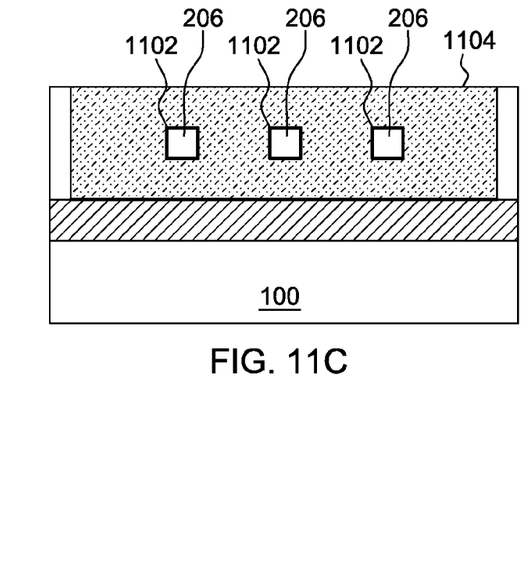
FIG. 11C is a cross-sectional view taken through the section line C-C' shown in FIG. 4A.

FIG. 11B shows a cross-sectional view, taken through the section line B-B' shown in FIG. 4A, depicting the formation of RMG 1100 in accordance with embodiments of the invention. A stack of materials for RMG 1100, known to someone skilled in the art, is deposited, using, for example, CVD or ALD, and may include a high-k dielectric material. In various embodiments, the RMG process includes the deposition of gate oxide layer 1102. In one embodiment, gate oxide layer 1102 is composed of a high-k dielectric material including without limitation hafnium dioxide ($HfO_2$), hafnium silicates ($HfSiO_x$), aluminum oxide ($Al_2O_3$), zirconium oxide ($ZrO_3$), or lanthanum oxide ($La_2O_3$). Gate oxide layer 1102 is deposited on the surface of second insulator layer 900, the exposed top and sidewall surface of spacer 500, the exposed portion of BOX 102, and the four sides of the exposed portion of fin 206. In one embodiment, the replacement metal gate includes workfunction setting metal (not shown) and fill metal 1104. The workfunction setting metal may be a material such as titanium nitride (TiN) or tantalum nitride (TaN) deposited over gate oxide layer 1102. It should be appreciated by one skilled in the art that the selection and use of a workfunction setting metal is based on the desired electrical characteristics of the finFET device. Fill metal 1104 is deposited over the workfunction setting metal, filling gate trench 1000 with, for example, tungsten (W) or aluminum (Al). The various layers and materials depicting the RMG process are presented as examples and are not meant to be limiting. Excess replacement gate materials may be removed from the surface of second insulator layer 900. For example, CMP may be used to remove the excess replacement gate materials of RMG 1100 that include gate oxide layer 1102, the workfunction setting metal, and fill metal 1104 that are not in gate trench 1000, from the surface of second insulator layer 900. The result is a replacement gate that is buried beneath, and surrounds, on four sides, a portion of fin 206. FIG. 11C is a cross-sectional view taken through the section line C-C' shown in FIG. 4A showing a cross-sectional view of RMG 1100 surrounding the four sides of fin 206.

Figure 12B:
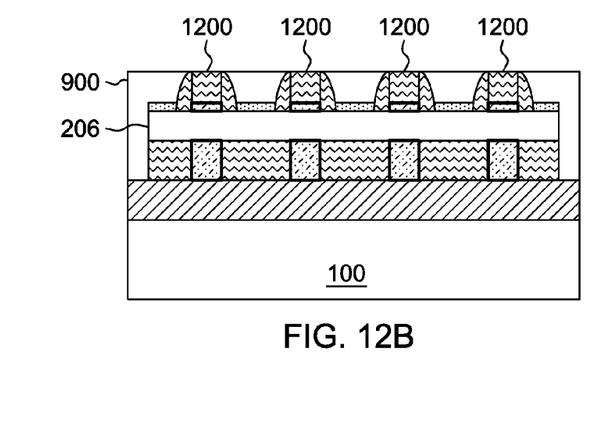
FIG. 12B shows a cross-sectional view taken through the section line B-B' shown in FIG. 4A depicting the removal of a top portion of a RMG in accordance with embodiments of the invention.
Figure 12C:
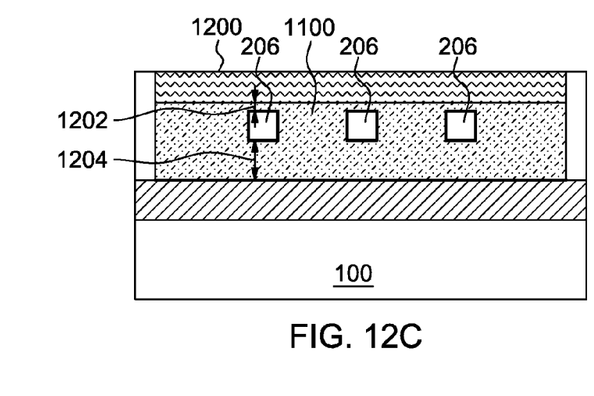
FIG. 12C is a cross-sectional view taken through the section line C-C' shown in FIG. 4A.

FIG. 12B shows a cross-sectional view taken through the section line B-B' shown in FIG. 4A depicting the removal of a top portion of RMG 1100 in accordance with embodiments of the invention. A top portion of RMG 1100 including fill metal 1104 and gate oxide layer 1102 may be etched using a timed RIE or wet etch to recess the top surface of RMG 1100 from the top surface of second insulator layer 900 such that the remaining thickness of RMG 1100 above the top surface of fin 206 is less than the thickness of RMG 1100 remaining below the bottom surface of fin 206. Insulator cap 1200 can then be formed in the recess created by the timed etch of the top surface of RMG 1100. According to various embodiments, an insulating material such as SiN or $SiO_2$ is deposited on the surface of second insulator layer 900, filling the recess created by the timed etch of RGM 1100. A planarizing process, such as CMP, can be used to remove excess insulating material from the surface of second insulator layer 900 leaving insulator cap 1200 over RMG 1100. FIG. 12C is a cross-sectional view, taken through the section line C-C' shown in FIG. 4A, showing a cross-sectional view of RMG 1100 surrounding fin 206, wherein thickness 1202 above fin 206 is less than thickness 1204 below fin 206.

Figure 13B:
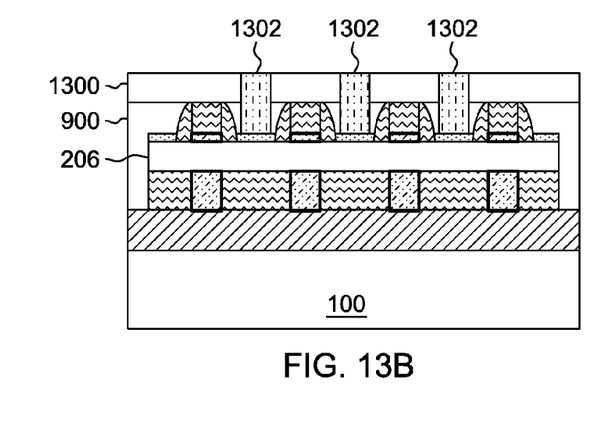
FIG. 13B shows a cross-sectional view taken through the section line B-B' shown in FIG. 4A depicting the deposition of a third insulator layer followed by the formation of a source/drain contact in accordance with an embodiment of the present invention.
Figure 13C:
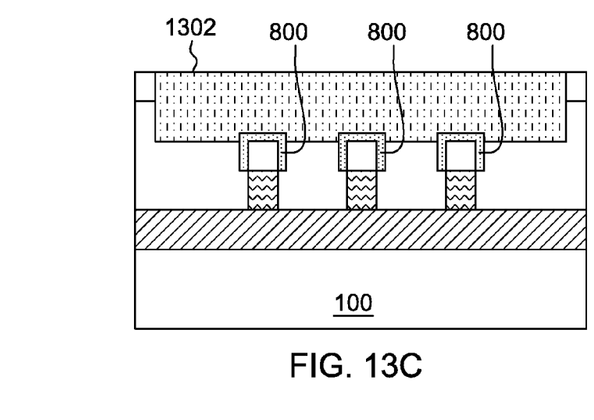
FIG. 13C is a cross-sectional view taken through the section line C-C' shown in FIG. 4A showing a cross-sectional view of a source/drain contact over an epitaxial layer.

FIG. 13B shows a cross-sectional view taken through the section line B-B' shown in FIG. 4A depicting the deposition of third insulator layer 1300 followed by the formation of source/drain contact 1302 in accordance with an embodiment of the present invention. FIG. 13C is a cross-sectional view taken through the section line C-C' shown in FIG. 4A showing a cross-sectional view of source/drain contact 1302 over epitaxial layer 800. Third insulator layer 1300 can be any insulating material such as $SiO_2$ deposited over second insulator layer 900 and insulator cap 1200 of FIG. 12B, using, for example, CVD or ALD. CMP may be used to planarize the surface of third insulator layer 1300. Following the deposition and CMP of third insulator layer 1300, a contact opening is formed in third insulator layer 1300 and second insulator layer 900, exposing a top portion of epitaxial layer 800. In various embodiments, standard lithographic processes are used to define the pattern of contact 1302 in a layer of photoresist (not shown) deposited over third insulator layer 1300. It can be appreciated by someone skilled in the art, that additional layers, such as a hard mask layer, may be included between the photoresist layer and second insulator layer 900 to facilitate the imaging and etch processes. The contact opening is then formed by removing third insulator layer 1300 and second insulator layer 900 from the areas not protected by the pattern in the photoresist layer, exposing a top portion of epitaxial layer 800, using for example RIE. Source/drain contact 1302 is formed in the created contact opening. In various embodiments, a thin layer of metal silicide may be deposited on all exposed silicon surfaces, including the exposed portions of epitaxial layer 800, using, for example, cobalt, titanium, tungsten, or nickel, to form a silicide liner (not shown). Source/drain contact 1302 can then be formed by depositing a contact metal such as tungsten or aluminum, filling the contact opening. CMP may be used to remove the excess contact metal from the top surface of third insulator layer 1300 resulting in source/drain contact 1302. It should be appreciated that the depth of the contact opening may be controlled such that the majority of source/drain contact 1302 is above the top surface of fin 206, whereas the majority of RMG 1100, as discussed previously, is below the bottom surface of fin 206, thereby reducing the parasitic capacitance that may occur between the source/drain contact and the buried gate. In other words, in the resultant finFET device, the source/drain contact is primarily disposed above the top surface of the fin, and the gate structure is primarily disposed below the bottom surface of the fin, such that parasitic capacitance between the source/drain contact and the gate structure is reduced.

The resulting semiconductor device may be included on a semiconductor substrate consisting of many devices and one or more wiring levels to form an integrated circuit chip. The resulting integrated circuit chip(s) can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described various embodiments of a low parasitic capacitance finFET device (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A method of fabricating a finFET device, the method comprising:
    forming a buried oxidized layer over a top surface of a semiconductor substrate;
    depositing a first semiconductor layer over the buried oxidized layer;
    depositing a second semiconductor layer over the first semiconductor layer, such that the first semiconductor layer can be preferentially etched with respect to the second semiconductor layer;
    forming a fin having four sides in the second semiconductor layer;
    creating a gate trench by removing a portion of the first semiconductor layer from beneath a portion of the fin such that a bottom surface of the fin is exposed;
    depositing a gate oxide layer over the fin such that the gate oxide layer surrounds a portion of the fin;
    depositing a metal gate structure over at least a portion of the gate oxide layer such that the metal gate structure surrounds the four sides of the fin; and
    reducing parasitic capacitance by forming a contact opening adjacent to the metal gate structure for a source/drain contact having a depth that is above the top surface of the fin.

2. The method of claim 1, wherein removing a portion of the first semiconductor layer further comprises;
    forming a dummy gate over a portion of the fin;
    removing the first semiconductor layer from beneath a portion of the fin not protected by the dummy gate;
    depositing an insulator beneath the fin extending from the bottom surface of the fin to a top surface of the dielectric layer; and
    removing the dummy gate.

3. The method of claim 1, further comprising;
    removing at least a top portion of the deposited gate structure such that thickness of the gate structure below the bottom surface of the fin is greater than thickness of the gate structure above the top surface of the fin.

4. The method of claim 1, wherein the first semiconductor layer is SiGe.

* * * * *